United States Patent [19]

Solomon

[11] Patent Number: 5,315,147
[45] Date of Patent: May 24, 1994

[54] MONOLITHIC FOCAL PLANE ARRAY

[75] Inventor: Allen L. Solomon, Fullerton, Calif.

[73] Assignee: Grumman Aerospace Corporation, Bethpage, N.Y.

[21] Appl. No.: 412,161

[22] Filed: Sep. 25, 1989

[51] Int. Cl.⁵ .................................. H01L 27/13
[52] U.S. Cl. ................... 257/448; 257/452; 437/83; 437/203
[58] Field of Search ........... 357/23.7; 437/203, 196, 437/83; 257/448, 452

[56] References Cited

U.S. PATENT DOCUMENTS

| 4,168,992 | 9/1979 | Anthony et al. | 437/134 X |
| 4,170,490 | 10/1979 | Anthony et al. | 437/134 X |
| 4,170,496 | 10/1979 | Anthony et al. | 437/138 X |
| 4,618,763 | 10/1986 | Schmitz | 250/211 R |
| 4,633,086 | 12/1986 | Parrish | 250/338 |
| 4,659,931 | 4/1987 | Schmitz et al. | 250/338 |
| 4,692,610 | 9/1987 | Szuchy | 250/227 |
| 4,698,603 | 10/1987 | Clarius | 332/31 R |
| 4,703,170 | 10/1987 | Schmitz | 250/211 R |
| 4,718,075 | 1/1988 | Horn | 378/91 |
| 4,734,577 | 3/1988 | Szuchy | 250/227 |
| 4,784,970 | 11/1988 | Solomon | 437/51 |
| 4,792,672 | 12/1988 | Schmitz | 250/211 R |
| 4,794,092 | 12/1988 | Solomon | 437/51 |
| 4,852,141 | 7/1989 | Horn | 378/147 |
| 4,857,477 | 8/1989 | Kanamori | 437/203 X |
| 4,870,031 | 9/1989 | Sugahara et al. | 437/83 X |
| 4,978,420 | 12/1990 | Bach | 437/203 X |
| 4,992,393 | 2/1991 | Kosaka et al. | 437/83 |

*Primary Examiner*—Peter A. Nelson
*Attorney, Agent, or Firm*—Stetina & Brunda

[57] ABSTRACT

An integrated circuit wafer is formed as a monolithic focal plane array having signal processing circuitry formed upon a first surface thereof and infrared detector elements formed upon a second surface thereof. A process for forming the same is also disclosed. The wafer has an array of waffle-like hollows formed upon one surface. The floor of each hollow has a dense array of small diameter vias formed thereon. The vias extend through the wafer to the second surface thereof. Conductive conduits are formed through the hollows and vias to connect infrared detectors on the second side of the wafer to their associated signal processing circuitry formed upon the first side of the wafer.

15 Claims, 4 Drawing Sheets

MONOLITHIC FOCAL PLANE ARRAY

Field of the Invention

The present invention relates generally to integrated circuit wafer fabrication, and more particularly to a wafer formed as a monolithic focal plane array having signal processing circuitry formed upon a first surface thereof and infrared detector elements formed upon a second surface thereof. A plurality of layers of signal processing circuitry can be formed upon the first surface of the monolithic focal plane array, permitting much of the detector system's signal processing to be performed at the focal plane. This reduces the requirements for data transmission and for off focal plane signal processing.

BACKGROUND OF THE INVENTION

Infrared detector modules are used for a variety of purposes including space surveillance. In view of the stringent environmental and performance demands of such systems, as well as space limitations relating to launch and orbit, substantial needs have developed to miniaturize the modules while retaining high performance and high reliability of operation.

For example, in order to provide accurate resolution in infrared imaging it may be necessary to space infrared detector elements by 4 mils or less. It is also desirable to provide some form of focal plane signal processing in order to limit the need to communicate raw data to remote processors. Signal processing may comprise such functions as filtering, gain normalization, and amplification. Consequently, there has developed a need to provide an improved module structure which not only satisfies the dense connectivity problems but also permits on-focal plane processing of the raw input signals.

The use of Z plane stacked layer substrates for signal processing circuitry is common in the art, particularly for area detector arrays. Z Plane structures satisfy the requirements for detector array miniaturization and on-focal-plane signal processing. However, it does not by itself remedy problems involving mechanical and electrical interconnection to the detector array, and where detector operation of a cryogenic temperature is required, refrigeration of the larger mass of material is more difficultly obtained. In Z plane structures a plurality of devices such as semiconductor substrates or printed circuit boards are mechanically and electrically connected to the detector array. Each Z plane stack of substrates extends perpendicularly from the back surface of the detector array along an axis commonly designated as the Z axis in the art. The plane upon which circuitry is formed in Z plane mounting is perpendicular to the plane upon which detectors are formed. Many Z plane layer substrates can extend from a single detector array, thereby greatly increasing the available surface area for signal Processing circuitry. The Z plane structure is used because of the limited real estate, or surface area, available for integrated signal processing circuit fabrication upon the front and back surfaces of the detector array. The Z plane structure can extend a substantial distance beyond the plane of the detector array, thereby providing a significant increase in the surface area available for integrated circuit fabrication. Highly sensitive infrared detecting focal plane arrays typically employ different substrate materials, one for the detector array and another for the signal processing circuit. Z plane structures have been designed with ceramic layer substrates, silicon integrated circuits and CdTe detector array substrates. Assembly of the focal plane array then requires mechanical and electrical connections or bonds to be Made between these different substrates. This method of assembly is often called a hybrid integrated circuit, as opposed to a monolithic integrated circuit, where a single substrate is used for the entire assembly. All the components are then totally integrated at a single unit. Since there are no mechanical or electrical bonds to be made, a higher degree of miniaturization can be obtained and many array elements and processing channels can be made by one set of fabrication processes. Such is the advancing state of the art for silicon monolithic integrated circuits.

The monolithic substrate in this invention is a large area, single crystalline wafer, such as readily available silicon. Graphotaxy, which is a form of epitaxy, where single crystalline films of the desired material so crystalline site laterally over polycrsytalline or amorphous structures. Detector arrays can then be made from single crystalline films of the desired material so formed on one side of the wafer and processor circuits on the other side. Stacked graphotaxially layers of silicon, for example, can then be used to provide sufficient areas for integrated circuit fabrication. The thickness of this processor stack made of thin film semiconductor layers separated by insulator films is many orders of magnitude less massive than stacked Z plane layers, which makes it far more acceptable for space borne applications.

Electrical connections between layers in the processor stack are readily made through windows in the insulator films. Electrical connections from the detector array to the processor circuits by an array of small diameter vias or electrical conduits through the wafer substrate. Prior art vias with diameters of 1/5 to 1/6 of the substrate thickness are common. Such vias are typically made by ether etching or laser drilling the substrate and then metalizing the resulting aperture. The use of vias having diameters in the range of 1/5 to 1/6 of the substrate thickness greatly reduces the available wafer surface area upon which detectors and signal processing circuitry can be fabricated. This is particularly true since the thickness of the wafer must be great enough to withstand the processing steps required to form the detector elements and signal processing circuitry. This prevents the use of a thin wafer which would permit correspondingly narrow vias.

The state of the art in both etching and laser drilling technology makes it extremely difficult to form long, thin vias. Sub-micron vias can be formed by either technique as long as they do not extend more than a few microns in length. Attempting to form vias having lengths in excess of a few microns results in flaring or misrouting of the vias due to inherent limitations in both the etching and laser drilling processes. Therefore, vias must have diameters proportional to the thickness of the substrate on which they are being formed in order to be formed true and parallel to their intended axes.

A monolithic focal plane array design having an array of extremely dense vias, with diameters in the one to twenty micron range is desirable. This permits the vias to be concentrated, thereby enabling a high density of detector elements. The vias must pass through wafers which are at least an order of magnitude thicker than the diameter of the vias. Such wafer thickness is required to maintain the mechanical integrity of the wafer through the detector and circuit fabrication Processes. The ability to form a dense array of such small diameter vias through a substrate which is at least an order of magnitude thicker than the via diameter is not present in the prior art.

As such, although the prior art has recognized the desirability of using a monolithic design for a focal plane array, the prior art has to date been unable to provide a means of fabricating a dense array of small diameter vias in a wafer which is at least an order of magnitude thicker than the diameter of the vias.

SUMMARY OF THE INVENTION

A wafer having a dense array of small diameter vias has signal processing circuitry formed upon a first surface thereof and photosensitive detector elements formed upon a second surface thereof. A plurality of layers of signal processing circuitry can be formed upon the first surface of the monolithic focal plane array, permitting much of the detector system's signal processing to be performed at the focal plane. This reduces the mass of the focal plane array and the requirements for data transmission and for off focal plane signal processing. The array of small diameter vias is formed in a manner that maintains structural integrity and provides a dense array of detector elements.

The wafer thus functions as an interface board by facilitating electrical communication between signal processing circuitry disposed upon a first surface of the board and an amay of detector elements disposed upon a second surface of the board. The interface board is comprised of a single crystalline material such as silicon so that integrated circuit fabrication techniques can be used to form both the signal processing circuitry and the detector element array.

Forming the signal processing circuitry upon the wafer of the monolithic focal plane array reduces or completely eliminates the need for a hybrid Z plane structure for signal processing circuitry. This greatly simplifies the fabrication and assembly processes while lowering the cost and improving the reliability of the detector system. The monolithic structure also eliminates the mechanical and electrical connection problems associated with interfacing the Z plane to the detector array.

A dense array of small diameter vias is formed in the relatively thick wafer by first etching an array of hollows into one surface of the wafer. The etched hollows form a waffle-like pattern in the surface of the wafer and each hollow is large enough to contain an array of small diameter vias. The ridges of the hollows insure that structural integrity is maintained to prevent damage during detector array and integrated circuit fabrication process and supply a base plane for electrical contacts on the second wafer surface.

The hollows are etched at such a depth that the floor of the hollow is close to the opposite surface of the wafer. Only a thin layer of substrate separates the two surfaces of the wafer at the floor of the hollow. This provides a thin section of wafer through which an array of via holes can be etched, drilled or cut to connect electrically the two surfaces of the wafer.

In the presently preferred embodiment, the hollows are formed by anisotropic etching of the surface of a (100) single crystalline silicon integrated circuit wafer. The wafer is formed to have its crystalline lattice structure oriented so that, upon anisotropic etching, the beveled portions of each hollow form a waffle-like array.

Once the via holes are formed, insulating and conductive and insulating layers can be formed upon both surfaces of the wafer and through the via holes, to provide electrical conduits between the two surfaces of the wafer. After such electrical conduits are formed the hollows and, if need be, the holes are filled. Signal processing circuitry can then be formed on one side of the wafer and detector arrays on the other. By forming alternating layers of single crystalline silicon and signal processing circuitry, the monolithic focal plane array can realize the advantages of a Z plane design in a substantially thinner structure.

The formation of small diameter vias in a relatively thin portion of a substrate, connected to conductive conduits formed by metal vapor deposition provides a blend of technologies which permits the electrical interconnection of the first and second surface of a relatively thick wafer. This provides a cost effective and practical solution to the problem of forming a monolithic focal plane array having a dense array of small diameter vias formed in a comparatively thick wafer.

DETAILED DESCRIPTION OF THE PREFERRED EMBODIMENT

The detailed description set forth below in connection with the appended drawings is intended as a description of the presently preferred embodiment of the invention, and is not to represent the only form in which the present invention may be constructed or utilized. The description sets forth the functions and sequence of steps for construction of the invention in connection with the illustrated embodiment. It is also to be understood, however, that the same or equivalent functions and sequences may be accomplished by different embodiments that are also intended to be encompassed within the scope of the invention.

Figure 1:
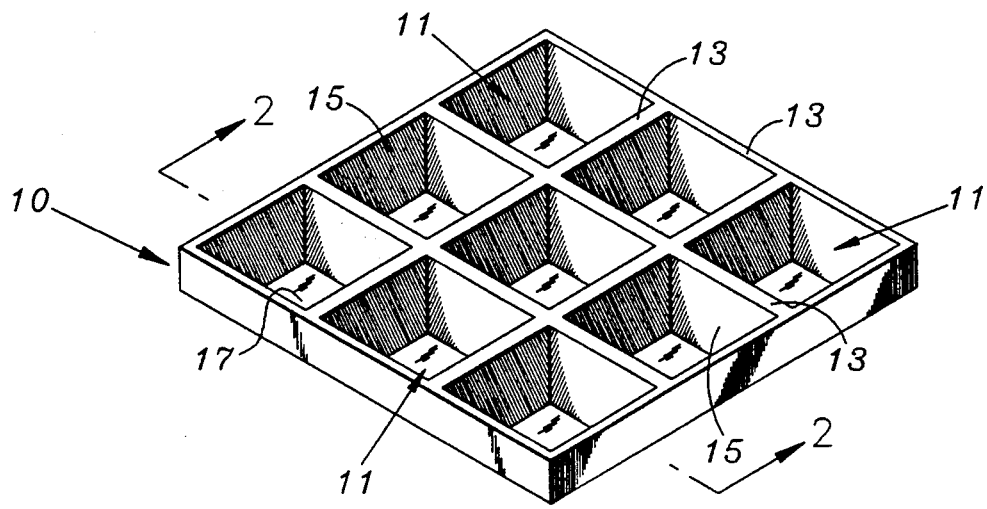
FIG. 1 is a top perspective view of the waffle-like array of hollows formed upon the first surface of the wafer.
Figure 2:
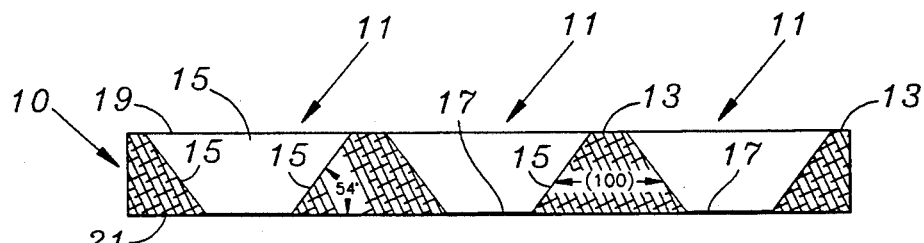
FIG. 2 is a cross-sectional view of the wafer of FIG. 1 taken along line 2.

Referring now to FIGS. 1 and 2, a portion of a single crystalline (100) silicon wafer 10 having an array of hollows 11 etched in a waffle-like pattern is illustrated. The silicon wafer 10 forms the substrate for a monolithic focal plane array having signal processing circuitry formed upon its upper or first surface and an array of detector elements formed upon its lower or second surface. The detector elements and the signal processing circuitry will be electrically connected by vias and metalized traces or conductive conduits.

The waffle-like pattern is comprised of hollows 11 and ridges 13. Each hollow 11 has four beveled sides 15 and a floor 17.

As can be seen in FIG. 2, the beveled sides 15 are formed at an angle of 54° to the first 19 and second 21 surfaces. The floor 17 of each hollow 11 is very thin compared to the overall thickness of the wafer 10.

The thickness of the floor 17 of each hollow 11 is thin enough that the floor 17 will not be an order of magnitude or more thicker than the diameter of vias formed therein. By inaking the floor 17 of each hollow 11 thin enough, small diameter via holes can be formed therethrough using conventional technology.

The hollows 11 are preferably formed by anisotropically etching (100) single crystalline silicon. The anisotropic etching technique utilized in the presently preferred embodiment effectively etches the single crystalline material in a predictable direction in relation to the crystalline lattice. In the presently preferred embodiment, the wafer 10 is (100) oriented single crystalline silicon. The anisotropic etching selectively etches away atoms of a silicon crystal until it reaches a portion of the lattice defined by the (111) plane. In effect, anisotropic etching results in a beveled edge, the angle of which is determined by the silicon crystal lattice. In the presently preferred embodiment, the silicon wafer is formed such that the (100) orientation of the silicon molecule is arrayed in the direction shown in FIG. 2. In view of the particular crystalline lattice structure of the silicon molecule, the beveled sides 15 are formed to be inclined at an angle of 54° as shown in FIG. 2. That bevel angle is repeatable so long as the (100) crystal orientation of the silicon wafer remains as indicated.

Figure 3:
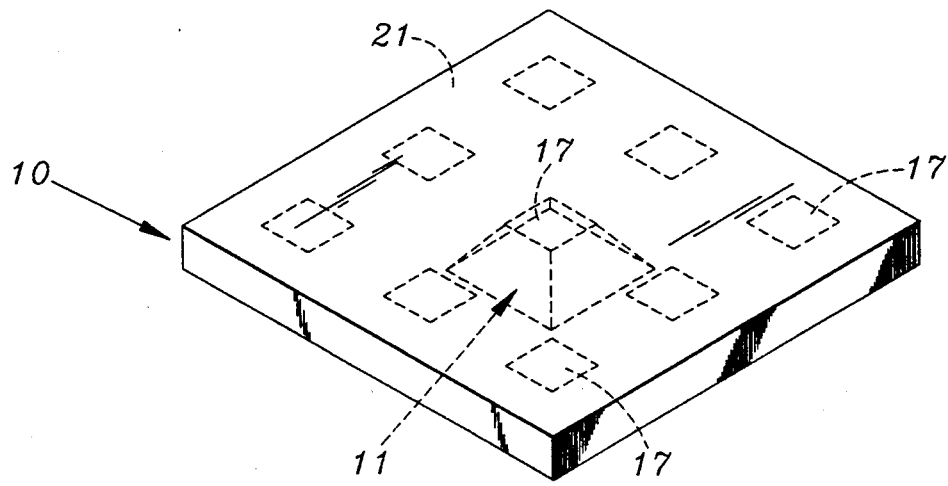
FIG. 3 is a bottom perspective view of the second surface of the wafer depicted in FIG. 1, showing as dashed lines the areas where the arrays of vias will be located upon the surface of the wafer and also showing as dashed lines one hollow formed on the opposite surface.

FIG. 3 shows the bottom or second surface 21 of the wafer 10. It depicts as dashed squares the floors 17 of the hollows 11, formed on the first surface 19 of the wafer 10. The complete hollow 11 associated with the floor 17 located at the center of the wafer 10 is also illustrated with dashed lines. Each of the other dashed squares 17 likewise has an associated hollow 11, which is not shown for clarity. The dashed squares 17 also indicate the areas upon the second surface 21 of the wafer 10 where a dense array of small diameter vias will be formed.

Figure 4:
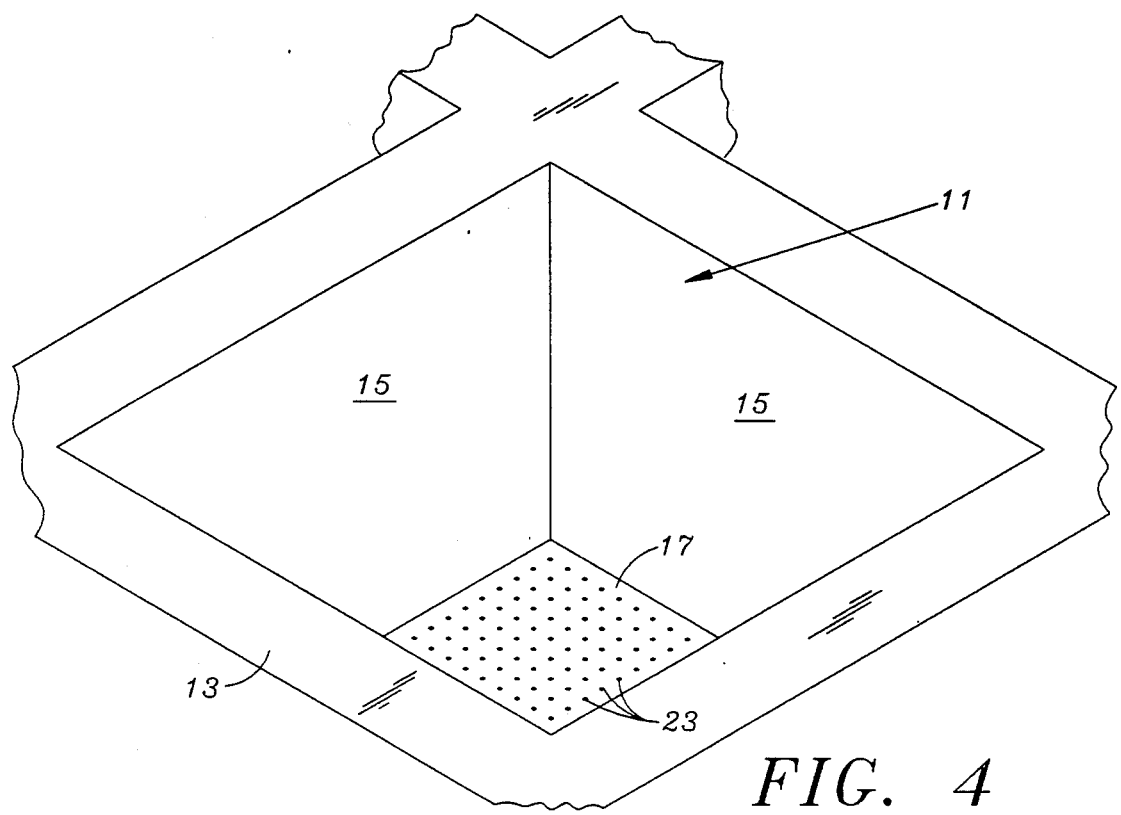
FIG. 4 is a perspective view of the floor of a single hollow showing the dense array of small diameter vias formed therein.

Refer now to FIG. 4 which is a perspective view of the floor 17 of a single hollow 11 showing a dense array of apertures or via holes 23 formed therein. The vias 23 extend through the floor 17, thereby passing from the first surface 19 to the second surface 21 of the wafer 10.

Figure 5:
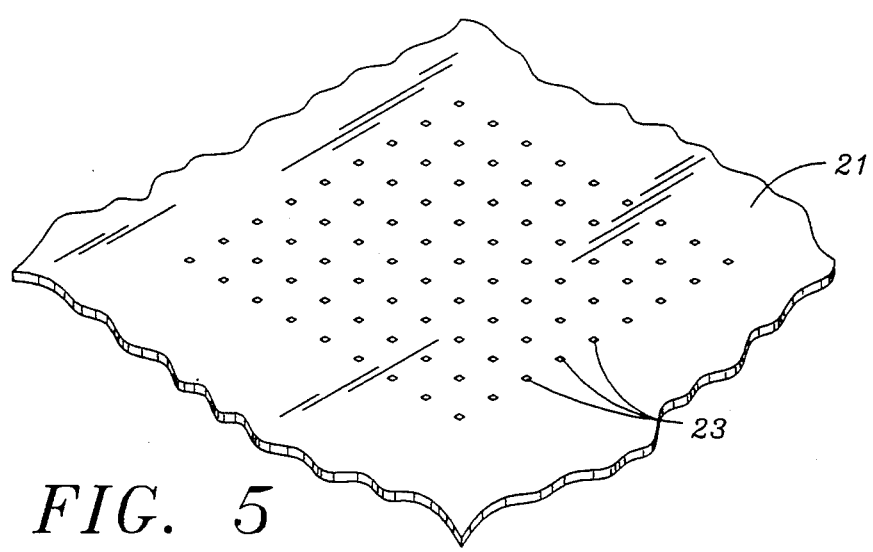
FIG. 5 is a perspective view of the second surface of the wafer showing the dense array of small diameter vias formed thereon.

FIG. 5 depicts a view of the vias 23 as observed from the second surfaces 21 of the wafer 10. This array of vias 23 corresponds to a single dashed square of FIG. 3. Each dashed square indicates a floor 17 of one hollow 11 and shows the position where an array of vias 23 is to be formed on the second surface 21 of the wafer 10. The arrays of vias 23 can be formed by etching or laser drilling the floors 17 of the hollows 11. The etching of such dense arrays of sub-micron vias is possible since the thickness of the wafer 10 at the floor 17 of the hollow 11 is less than an order of magnitude greater than the diameter of the vias 23. By providing the thin floor 17 in the bottom of each hollow 11, the thickness of the wafer 10 has been reduced, thus permitting vias 23 are to be formed.

The limitation of how small in diameter a via can be formed is directly related to the thickness of the substrate to which it is formed. That is, the thinner the substrate, the less the diameter of the via can be. Having such a thin floor 17 permits conventional photolithographic etching techniques to be used to form the arrays of via holes 23 in the floors 17 of the hollows 11. Alternatively, a laser of a suitably short wavelength may be used to form the array of vias 23. Other techniques, such as ion beam milling can be used.

Figure 6:
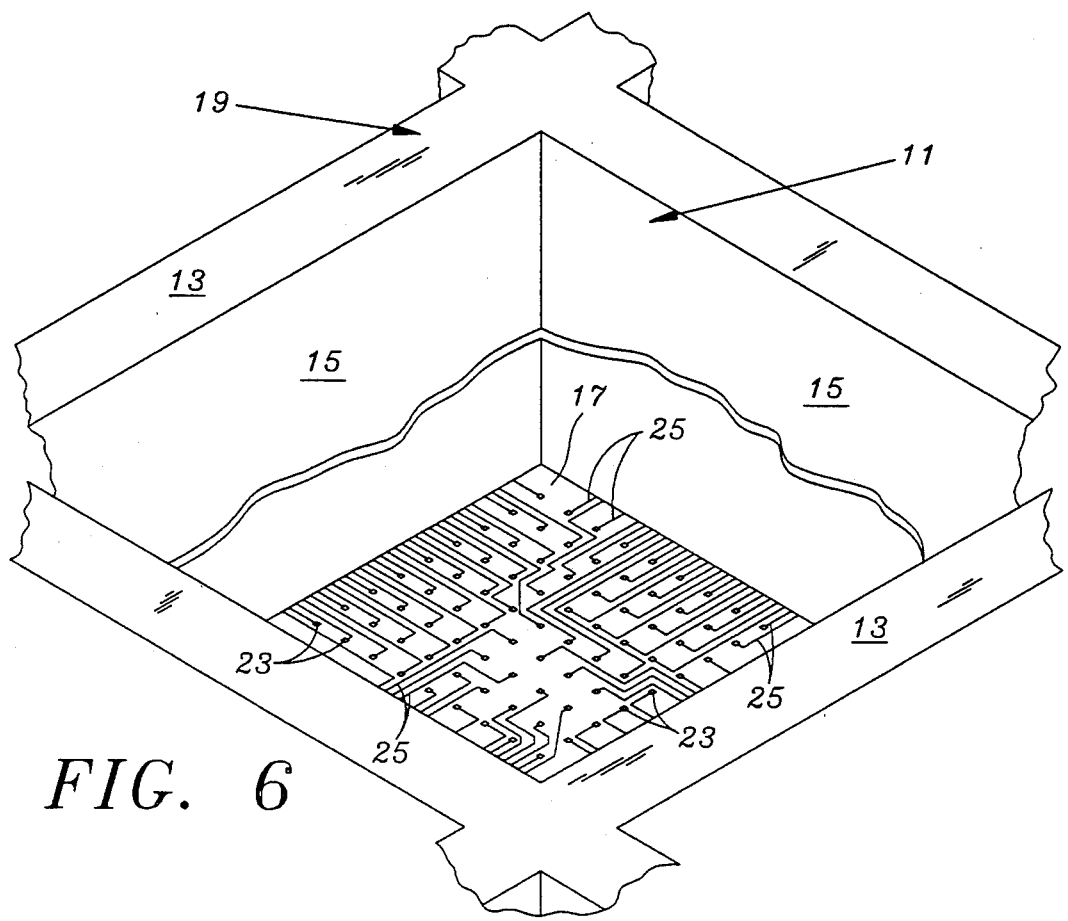
FIG. 6 is a perspective view of the floor of a single hollow showing the electrical conduits formed thereon and connected to each via.
Figure 7:
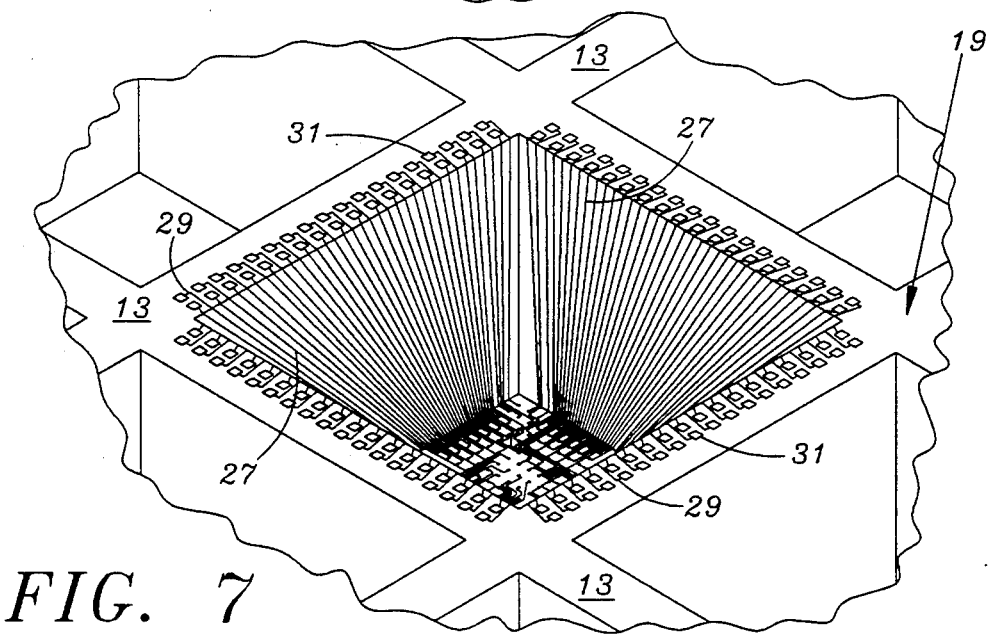
FIG. 7 is a perspective view of a hollow showing electrical conduits formed upon the beveled surfaces of the hollow and electrically connecting the conduits formed upon the floor to the contact pads formed upon the ridges of the wafer.

After the hollows 11 and vias 23 have been formed in the wafer 10, the first 19 and second 21 surfaces of the wafer 10 are film oxidized to provide a first insulating layer comprised of silicon dioxide ($SiO_2$). Next a refractory conductor, such as polysilicon or tungsten, is deposited to fill or to coat the walls of the vias 23, thereby forming first conductive conduits. As shown in FIG. 6 this film is also patterned to form metalized paths or traces 25, from the vias 23 to the beveled sides 15. As shown in FIG. 7 the film is further patterned to form traces 27 which extend from the floor 17 of each hollow 11 to the ridges 13 (i.e. the surface 19 adjacent the hollow 11). The film is further patterned to provide traces 29 and pads 31 upon the ridges 13. Traces 25, 27, and 29 form second conductive conduits which are connected to the first conductive conduits contained within vias 23. The traces 25, 27, and 29, together with vias 23 provide an electrical connection between the first 19 and second 21 surfaces of the wafer 10.

Next the first 19 surface of the wafer, except for the pads 31, is coated with a second insulator. Then, the hollows 11 are filled with a body of polycrystalline silicon. The first surface 19 is then coated with a third insulator except for the pads 31.

Figure 8:
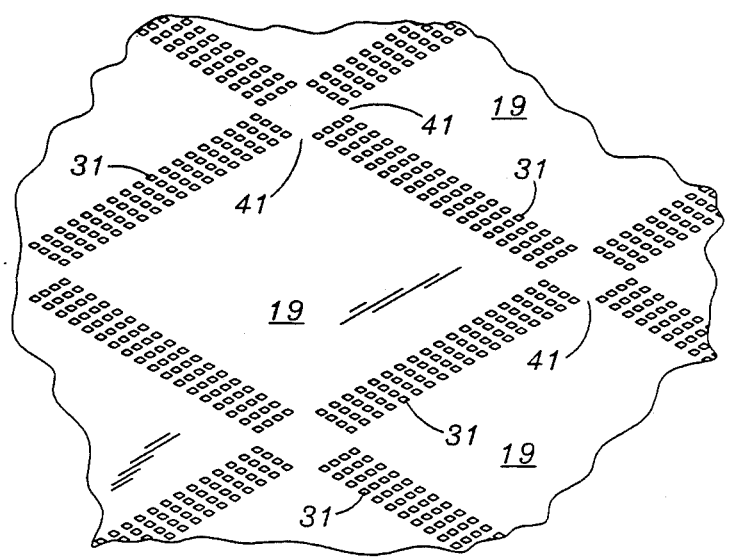
FIG. 8 is a perspective view of the contact pad array formed upon the integrated processor circuitry, first surface of the wafer.

A single crystalline silicon substrate is next grown graphotaxially from Single crystalline regions either at the edges of the wafer, which are outside the rectangular array of hollows 11 on the first surface 19, or from regions at the corners 41 of the contact pad 31 arrays shown in FIG. 8. Graphotaxial growth permits the formation of a single crystalline silicon layer upon a nonsingle crystalline substrate. Graphotaxial growth occurs when a single crystalline region is used as a seed from which lateral epitaxial growth occurs across the surface of the substrate. Crystal growth takes place at the seed and new material is added to the seed such that the crystalline structure and orientation of the seed material is maintained. The result is a single crystalline layer having the same structure and orientation as the seed region. A single crystalline seed region may be maintained upon the surface of the wafer to provide a region from which another overlying semiconductor layer can be grown.

This graphotaxially grown layer of single crystalline silicon is used as the substrate for integrated circuit fabrication. Additional layers may be grown graphotaxially to provide an overlying substrate. The pads may either be masked off to prevent their being covered by the graphotaxially grown substrate, or the substrate may be etched away if the pads are covered. Top metal contacts and traces may be formed upon the substrate in the conventional manner.

Figure 9:
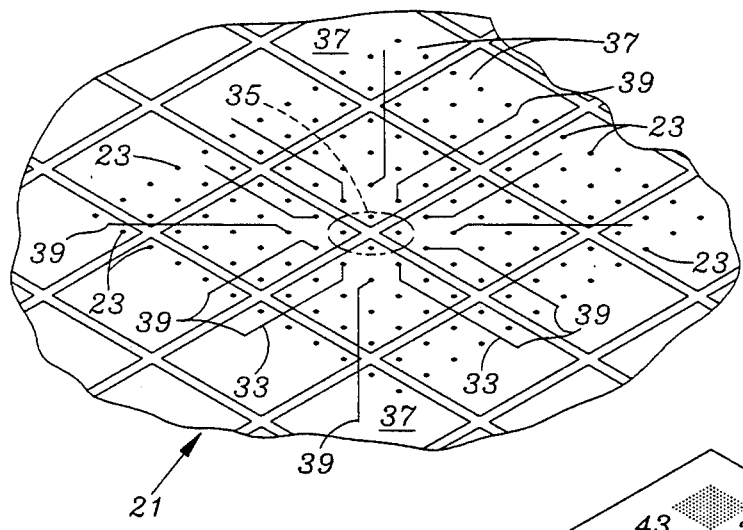
FIG. 9 is a perspective view of the opposite second surface of the wafer showing the leads which electrically connect the vias to the detector array elements formed over the top of the vias and leads.

FIG. 9 illustrates the second surface 21 of the wafer 10 and shows the traces 33 which form third conductive conduits and electrically connect the vias 23 to detector element electrode pads 37 which are to be formed over top of the vias 23 and traces 33. The third conductive conduits or traces 33 are formed upon the first insulator layer. The traces 33 extend from the rectangularly arrayed vias 23 and fan out to the rectangular detector array electrode 37 pattern. The second surface 21 of the wafer 10 is coated with a fourth insulator which covers the traces 33 except for where they are to contact the detectors. Detector element electrodes 37 are then formed upon the fourth insulator. Each trace 33 terminates at a single detector 3 7 , i.e., the termination 39 of each trace 33 is electrically connected to a detector element electrode 37.

The center four vias 23, within the dashed circle 35 of FIG. 9, do not require traces since they are directly below the center four detector elements 37. The center four vias 35 are connected directly to the center four detector element electrodes 37. Traces 33 are shown extending from the twelve vias 23 which surround the center four vias 35. These traces 33 provide electrical contact to the twelve detector element electrodes 37 which surround the center four detector elements 37. Traces are not shown extending from every via 23 for clarity. Each of the 144 detector element electrodes 37, except for the center four, is connected to a via 23 by a trace 33.

Mercury cadmium telluride (HgCdTe) graphotaxially grown from a window or exposed edge of the single crystalline silicon second surface 21 of the wafer 10 to form photosensitive infrared detector elements. The single crystalline silicon substrate would be graphotaxially grown over the fourth insulator layer which covers the traces 33 and the detector electrodes 37. Alternatively, an intermediate epitaxial layer of gallium arsenide can be formed graphotaxially upon single crystalline silicon substrate to act as a substrate for the (HgCdTe) which can be grown epitaxially upon this intermediate substrate layer.

Figure 10:
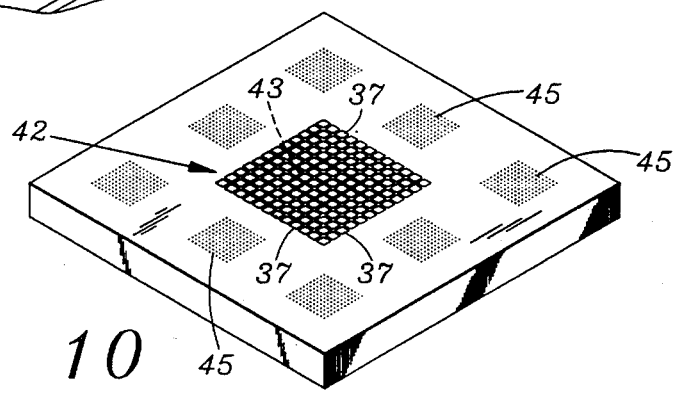
FIG. 10 is a perspective view of the surface of the wafer showing an array of detectors formed over an array of vias which pass through the wafer, and also eight more via arrays.

Referring now to FIG. 10, an array of detector elements, designated generally as 42, is shown formed over the center array 43 of the vias 23 (individual vias 23 not shown for clarity). Eight other arrays 45 of vias 23 surround the center array 43. Because the array of detector elements 42 is somewhat larger than the underlying array of vias 43, the traces 33 depicted in FIG. 9 are required to provide electrical connection of each detector element electrode 37 of array 42 to each via 23 of via array 43. Similar arrays of detector elements are formed over each of the via arrays 45. These detector elements and the traces 33 are not shown in FIG. 10 for clarity.

Wafer fabrication is concluded by trimming the completed wafer to the desired size of focal plane array.

SUMMARY OF THE METHOD OF FABRICATION

The process of forming the monolithic focal plane array of the present invention commences with the anisotropic etching of the first surface 19 of a (100) silicon wafer 10 to form a plurality of hollows 11 having sloped sides 15 which form an angle of 54° to the first 19 and second 21 surfaces.

Next a plurality of via holes 23 is etched or laser drilled through the floor 17 of each hollow 11. Each of the vias 23 extends from the floor 17 of a hollow 11 to the second surface 21 of the wafer 10, thereby providing a means for forming a first conductive conduit between the first 19 and second 21 surfaces of the wafer 10.

Next the wafer 10 is oxidized to coat both its first 19 and second 21 surfaces with a first insulator comprised of $SiO_2$.

A refractory conductor such as polysilicon or tungsten is then deposited within the via 23 to form a first conductive conduit. The vias 23 can either have a coating of the refractory conductor formed upon their walls or be completely filled with the refractory conductor.

Traces 25, 27, and 29 are next formed upon the floor 17, beveled sides 15, and ridges 13 of each hollow 11 to provide a second conductive conduit which electrically connects from the second surface 21 of the wafer 10 to the ridges 13 formed upon the first surface 19 of the wafer 10.

Next a portion of the first surface 19 of the wafer 10 is coated with a second insulator to insulate the second conductive conduits formed by traces 25, 27 and 29 from subsequent layers. The terminations of the traces 29, which may be pads 31 formed upon the ridges 13 of the first side 19 of the wafer 10 when the traces 25, 27 and 29 are formed, are not coated with the second insulator. This permits electrical contact of the traces 25, 27 and 29 to subsequently formed signal processing circuitry.

Next the hollows 11 are filled with polysilicon to a level substantially equal to the plane of the first surface 19 of the wafer 10.

Next a portion of the first surface 19 of the wafer 10 is coated with a third insulator. Again, the terminations or pads 31 of the traces 25, 27 and 29 are not coated with the third insulator so as to provide electrical connection to subsequently formed signal processing circuitry.

Next a single crystalline layer is grown graphotaxially across the third insulator formed upon the first surface 19 of the wafer 10.

Third conductive conduits or traces 33 are then formed upon the second surface 21 of the wafer 10 which contact the first conductive conduits within vias 23 at one end and which will contact the individual detector element electrodes 37 at their opposite end.

A fourth insulator is then formed over a portion of the second surface 21 of the wafer 10 to insulate the traces 33 from subsequent layers. The ends of the traces 33 which are to be electrically connected to the photosensitive detector element electrodes 37 are not coated with the insulating layer.

Next, signal processing circuitry can be formed upon the first surface 19 of the wafer 10. A separate graphotaxially grown layer of single crystalline silicon can be grown over the signal processing circuitry to form the substrate for a second layer of signal processing circuitry. The process of graphotaxially growing a single crystalline substrate and forming signal processing circuitry upon that substrate can be repeated to form a plurality of layers of signal processing circuitry upon the first side of the wafer.

Finally, detector element electrodes 37 are formed upon the insulating layer of the second surface 21. To form the photosensitive detector elements, a layer of HgCdTe can be grown graphotaxially from a window to the silicon wafer surface or epitaxially over an intermediate layer of gallium arsenide, which is graphotaxially grown on the silicon wafer.

Various modifications and enhancements may be made within the scope of the present invention. For example, the precise angle of the beveled surfaces may be varied in accordance with the particular material and the characteristic crystalline structure of that material. Additionally, mechanical or optical methods may be used to form the beveled surfaces described above. Furthermore, uses other than in an infrared detector array may be found for the densely arrayed sub-micron vias of the present invention.

What is claimed is:

1. A single crystalline wafer having first and second surfaces, the wafer having the structural integrity required to survive the fabrication of integrated circuitry upon its first and second surfaces, the wafer comprising:
   (a) at least one hollow formed in the first surface of the wafer, said hollow having a floor and beveled sides;
   (b) a plurality of apertures which extend from the floor of each hollow, through the floor of the hollow, to the second surface of the wafer; and
   (c) wherein the wafer is at least an order of magnitude thicker than the diameter of said apertures.

2. The wafer as recited in claim 1 further comprising first conductive conduits formed within said apertures, and a corresponding number of second conductive conduits extending along the inclined side walls, said first and second conductive conduits being connected to provide electrical connection between the first and second surfaces of the wafer.

3. The wafer as recited in claim 2 wherein the first conductive conduits are formed by depositing a refractory conductor within said apertures.

4. The wafer as recited in claim 3 wherein the beveled sides of the hollows are formed at an angle of approximately 54° to the upper and lower surfaces.

5. The wafer as recited in claim 3 wherein the apertures are formed by etching.

6. The wafer as recited in claim 3 wherein the apertures are formed by laser drilling.

7. A detector interface board for facilitating electrical communication between circuitry disposed upon a first surface of the board and an array of detector elements disposed upon an opposing second surface of the board, the board comprising:
   (a) a wafer comprising at least one hollow having a floor and beveled side walls formed in the first surface of the wafer;
   (b) a plurality of apertures formed through the floor of each hollow, the apertures extending from the floor of each hollow to the wafer second surface;
   (c) a plurality of first conductive conduits formed within each of the apertures;
   (d) a corresponding number of second conductive conduits which extend along the hollow sidewalls from the apertures;
   (e) a body of polysilicon formed within each of said hollows;
   (f) a single crystalline layer formed upon the wafer first surface;
   (g) a plurality of third conductive conduits formed upon the wafer second surface, each of said third conductive conduits being connected to a dedicated aperture;
   (h) a single crystalline layer graphotaxially formed upon the wafer second surface;
   (i) an array of detector elements formed upon the single crystalline layer of the wafer second surface, each of said detector elements being connected to a dedicated aperture by the third conductive conduits; and
   (j) signal processing circuitry formed upon the single crystalline layer, said signal processing circuitry being connected to the first conductive conduits.

8. The detector interface board as recited in claim 7 further comprising:
   (a) a first insulator, said first insulator coating both the first and second surfaces of the wafer;
   (b) a second insulator, said second insulator coating a portion of the first surface of the wafer including said second conductive conduits, to insulate said second conductive conduits from subsequent layers;
   (c) a third insulator, said third insulator coating a portion of the first surface of the wafer including the body of polysilicon formed within each of said hollows to insulate the body of polysilicon from subsequent layers; and
   (d) a fourth insulator, said fourth insulator coating a portion of the second surface of the wafer including said third conductive conduits formed upon the second surface of the wafer to insulate said third conductive conduits from subsequent layers.

9. The detector interface board as recited in claim 7 wherein HgCdTe is used to form the array of detector elements.

10. The detector interface board as recited in claim 7 wherein the array of detector elements are formed graphotaxially directly upon said single crystalline layer formed upon the second surface of the wafer.

11. The detector interface board as recited in claim 7 wherein the array of detector elements are formed upon a layer of gallium arsenide which is formed upon said single crystalline layer formed upon the second surface of the wafer.

12. The detector interface board as recited in claim 7 wherein the first conductive conduits are formed by depositing a refractory conductor within said apertures.

13. The detector interface board as recited in claim 7 wherein the beveled sides of the hollows are formed at an angle of approximately 54° to the upper and lower surfaces.

14. The detector interface board as recited in claim 7 wherein the apertures are formed by etching.

15. The detector interface board as recited in claim 7 wherein the apertures are formed by laser drilling.

* * * * *